United States Patent
Curiel et al.

(10) Patent No.: US 9,799,617 B1
(45) Date of Patent: Oct. 24, 2017

(54) METHODS FOR REPACKAGING COPPER WIRE-BONDED MICROELECTRONIC DIE

(71) Applicant: FREESCALE SEMICONDUCTOR INC., Austin, TX (US)

(72) Inventors: Mitchell Curiel, Mesa, AZ (US); Huan Gim Chan, Subang Jaya (MY); Wan Foong Kho, Petaling Jaya (MY)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/221,372

(22) Filed: Jul. 27, 2016

(51) Int. Cl.
*H01L 23/00* (2006.01)

(52) U.S. Cl.
CPC ............. *H01L 24/03* (2013.01); *H01L 24/89* (2013.01); *H01L 24/98* (2013.01); *H01L 2224/033* (2013.01)

(58) Field of Classification Search
CPC ........................................................ H01L 22/30
See application file for complete search history.

(56) References Cited

U.S. PATENT DOCUMENTS

| | | | |
|---|---|---|---|
| 6,521,479 B1 * | 2/2003 | Harrison | G01R 31/2898 257/29 |
| 8,409,924 B2 | 4/2013 | Tomita et al. | |
| 8,716,867 B2 | 5/2014 | Ko et al. | |
| 8,981,568 B2 | 3/2015 | Rathburn | |
| 9,224,641 B2 | 12/2015 | Sheats | |
| 9,229,553 B2 | 1/2016 | Weaver et al. | |
| 9,231,328 B2 | 1/2016 | Rathburn | |

FOREIGN PATENT DOCUMENTS

WO  2009012423 A1  1/2009

OTHER PUBLICATIONS

Stoukatch, S. et al., "Evaluation of Aerosol Jet Printing (AJP) Technology for Electronic Packaging and Interconnect Technique," IEEE Electronic System-Integration Technology Conference (ESTC), Sep. 2012, p. 1-5.
Barberan, E. et al., "Die Repackaging for Failure Analysis", in Microelectronics Reliability, vol. 45, Issue 9-11, Sep.-Nov. 2005, pp. 1576-1580.
Cargill, L., et al., Electroless Plating of Aluminum Bond Pads on Semiconductor Devices That Were Originally Bonded with Copper Wires to Allow for Repackaging to Facilitate Failure Analysis, ip.com Prior Art Database IPCOM000237915D.

* cited by examiner

*Primary Examiner* — Yu-Hsi D Sun (57) ABSTRACT

Methods for repacking copper wire bonded microelectronic die (that is, die having bond pads bonded to copper wire bonds) are provided. In one embodiment, the repackaging method includes the step or process of obtaining a microelectronic package containing copper wire bonds and a microelectronic die, which includes bond pads to which the copper wire bonds are bonded. The microelectronic die is extracted from the microelectronic package in a manner separating the copper wire bonds from the bond pads. The microelectronic die is then attached or mounted to a Failure Analysis (FA) package having electrical contact points thereon. Electrical connections are then formed between the bond pads of the microelectronic die and the electrical contact points of the FA package at least in part by printing an electrically-conductive material onto the bond pads.

17 Claims, 5 Drawing Sheets

METHODS FOR REPACKAGING COPPER WIRE-BONDED MICROELECTRONIC DIE

TECHNICAL FIELD

Embodiments of the present invention relate generally to microelectronic packaging and, more particularly, to methods for repackaging copper wire bonded microelectronic die to, for example, support die failure analysis.

BACKGROUND

A microelectronic package commonly contains one or more microelectronic die on which integrated circuits (ICs), microelectromechanical systems (MEMS), or other such devices are fabricated. The bond pads of the microelectronic die may be electrically interconnected to other electrically-conductive features within the microelectronic package, such as metal routing features of a Printed Circuit Board (PCB), an interposer, a leadframe, or a Redistribution Layer (RDL) structure, to list but a few examples. Wire bonding has long been utilized to form such electrical interconnections between the bond pads of the microelectronic die and other electrically-conductive features within a microelectronic package. Wire bonds have traditionally been produced utilizing gold wire; however, the usage of copper wire in wire bonding has recently become more common in view of the lower electrical resistivity and decreased cost of copper as compared to gold and other wire bond materials.

A wire bonded microelectronic die may be repackaged when, for example, failure analysis is desirably performed on the microelectronic die. To repackage a wire bonded microelectronic die, the microelectronic die is initially extracted from its original microelectronic package. The wire bonded microelectronic die may be extracted by first thinning (e.g., grinding) the frontside and/or backside of the microelectronic package. Encapsulant surrounding the microelectronic die, if such encapsulant is present, may then be removed by treatment with an appropriate etchant, such as fuming nitric acid. The newly-extracted microelectronic die is next attached to a second package, which is referred to herein as a "failure analysis package." Wire bonding may again be employed to electrically interconnect the bond pads of the microelectronic die to electrical contact points, such as contact pads, provided on the failure analysis package. Failure analysis may then be performed on the repackaged microelectronic die to, for example, allow electrical defect localization on the frontside and/or backside of the microelectronic die.

BRIEF DESCRIPTION OF THE DRAWINGS

At least one example of the present invention will hereinafter be described in conjunction with the following figures, wherein like numerals denote like elements, and.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect.

As briefly noted above, it may be desirable to repackage a wire bonded microelectronic die to, for example, facilitate failure analysis of the microelectronic die. Indeed, there exists an ongoing demand for improved failure analysis techniques as wafer fabrication technology moves to ever smaller nodes and the complexity of microelectronic package designs increases. Repackaging of a wire bonded microelectronic die typically entails extraction of the microelectronic die from its original microelectronic package. Die extraction may involve thinning (e.g., grinding) of the microelectronic package and removal of any encapsulant surrounding the wire bonded microelectronic die. The encapsulant surrounding the wire bonded microelectronic die may be removed by treatment with an appropriate etch chemistry, such as a fuming nitric acid. After extraction from its original package, the microelectronic die may be installed within a new package, which is referred to herein as a "failure analysis package" or, more simply, as a "FA package." To complete the repackaging process, electrical interconnections are formed between the bond pads of the extracted microelectronic die and electrical contact points (e.g., contact pads or terminals) provided on the FA package. Wire bonding has traditionally been employed to form such electrical interconnections between the die bond pads and the FA package contact points.

Fuming nitric acid (and other etchants selective to the encapsulant material) tend to dissolve gold at a relatively low etch rate, while dissolving copper at a relatively high etch rate. Thus, in instances wherein the microelectronic die is wire bonded utilizing gold (Au) wire, treatment with fuming nitric acid tends to leave intact those portions of the Au wire bonds remaining after thinning of the microelectronic package. Specifically, following package thinning and nitric acid treatment, the enlarged terminal ends or "ball portions" of the Au wire bonds may remain intact and overlie the bond pads of the newly-extracted microelectronic die. The subsequently-formed, "repackaging" wire bonds may thus be bonded directly to the remaining ball portions of the Au wire bonds overlying the bond pads. The remaining ball portions may have substantially planar surfaces as a result of packaging thinning such that highly reliable, robust electrical connections are formed between the die bond pads and FA package contact points. In instances wherein the microelectronic die is wire bonded utilizing copper (Cu) wire, however, treatment with fuming nitric acid tends to fully destroy any remaining portions of the Cu wire bonds and expose the underlying die bond pads.

In addition to having a higher etch rate in the presence of fuming nitric acid, Cu wire is also significantly harder than Au wire. Consequently, in contrast to wire bonding utilizing Au wire, wire bonding utilizing Cu wire tends to create relatively pronounced, centralized depressions or concavities in the die bond pads, especially when the bond pads are composed of aluminum or another material that is softer than copper. Bond pads having such centralized depressions or cavities are referred to herein as "severely concave bond pads." While the Cu wire bonded microelectronic die remains within its original microelectronic package, the depressions formed in the severely concave bond pads are filled by the Cu wire bond material and thus have little to no impact on the structural robustness or functionality of the package. However, the central depressions formed in such severely concave bond pads can become problematic should repackaging of the Cu wire bonded microelectronic die become desirable. As the Cu wire bonds are typically eradicated through the encapsulant-removing etch process, the severely concave bond pads are exposed and the central depressions no longer filled by conductive material. The upper surfaces of the severely concave bond pads may be characterized by highly non-planar, uneven, or physically-distorted surface geometries, which may render it overly difficult or impractical to form reliable electrical connections to the bond pads utilizing a conventional wire bonding approach. Repackaging of the microelectronic die and subsequent failure analysis efforts may be frustrated as a result.

The following describes methods for repackaging Cu wire bonded microelectronic dies, which overcome the above-described limitations. Embodiments of the repackaging method feature a unique post die-extraction printing process during which an electrically-conductive material, such as a metal-containing ink, is deposited onto the bond pads of a newly-extracted microelectronic die. A three dimensional (3D) printing process, such as aerosol jet printing, is employed for this purpose and enables the electrically-conductive material to be deposited in a highly precise (e.g., computer-controlled) manner. In certain embodiments, the post die-extraction printing process is employed to produce electrically-conductive tracks or traces, which electrically interconnect the bond pads of the extracted microelectronic die with electrical contact points (e.g., contact pads or terminals) provided on an FA package. Such printed electrically-conductive traces provide a reliable electrical connection to the die bond pads, even when physically distorted or pocketed with concavities from previous Cu wire bonding. Additionally or alternatively, the post die-extraction printing process can be controlled to structurally rebuild or restore damaged (e.g., severely concave) regions of the die bond pads. The restored die bond pads can then be electrically interconnected with the FA package contact points utilizing a suitable interconnection technique, such as by wire bonding or by continuing the 3D printing process to further deposit electrically-conductive traces, as described above. In this manner, the extracted microelectronic die and FA package can be electrically interconnected in a highly reliable and repeatable manner, despite extraction of the microelectronic die from an original microelectronic package containing Cu wire bonds.

In embodiments wherein the post die-extraction printing process is utilized to deposit printed traces interconnecting the bond pads of the extracted microelectronic die with corresponding FA package contact points, it may also be desirable to deposit one or more dielectric bridge structures at selected junctures between the microelectronic die and the FA package. The dielectric bridge structures can be produced utilizing various different controlled deposition processes including a 3D printing process (e.g., aerosol jet printing) similar to or substantially identical to that utilized to deposit the printed traces. In embodiments wherein the bond pads of the microelectronic die and the electrical contact points of the FA package are located at different elevations or heights, each dielectric bridge structure may be produced to have a sloped or ramped upper surface accommodating such disparities in the elevation. In this manner, the dielectric bridge structures may help provide a gradual, non-stepped surface between the die bond pads and the FA package contact points onto which the electrically-conductive traces can be conformally printed. Additionally or alternatively, in certain implementations, the dielectric bridge structure may substantially fill lateral gaps formed between the microelectronic die and inner sidewalls of the FA package bordering an open cavity in which the microelectronic die is installed. As a still further possibility, the dielectric bridge structure may be deposited to cover other electrically-conductive features present on the bond pad-bearing surface of the microelectronic die, which are located near the die bond pads and which are desirably electrically isolated from the printed electrically-conductive traces. Exemplary embodiments of such a repackaging method will now be described in conjunction with FIGS. 1-7.

Figure 1:
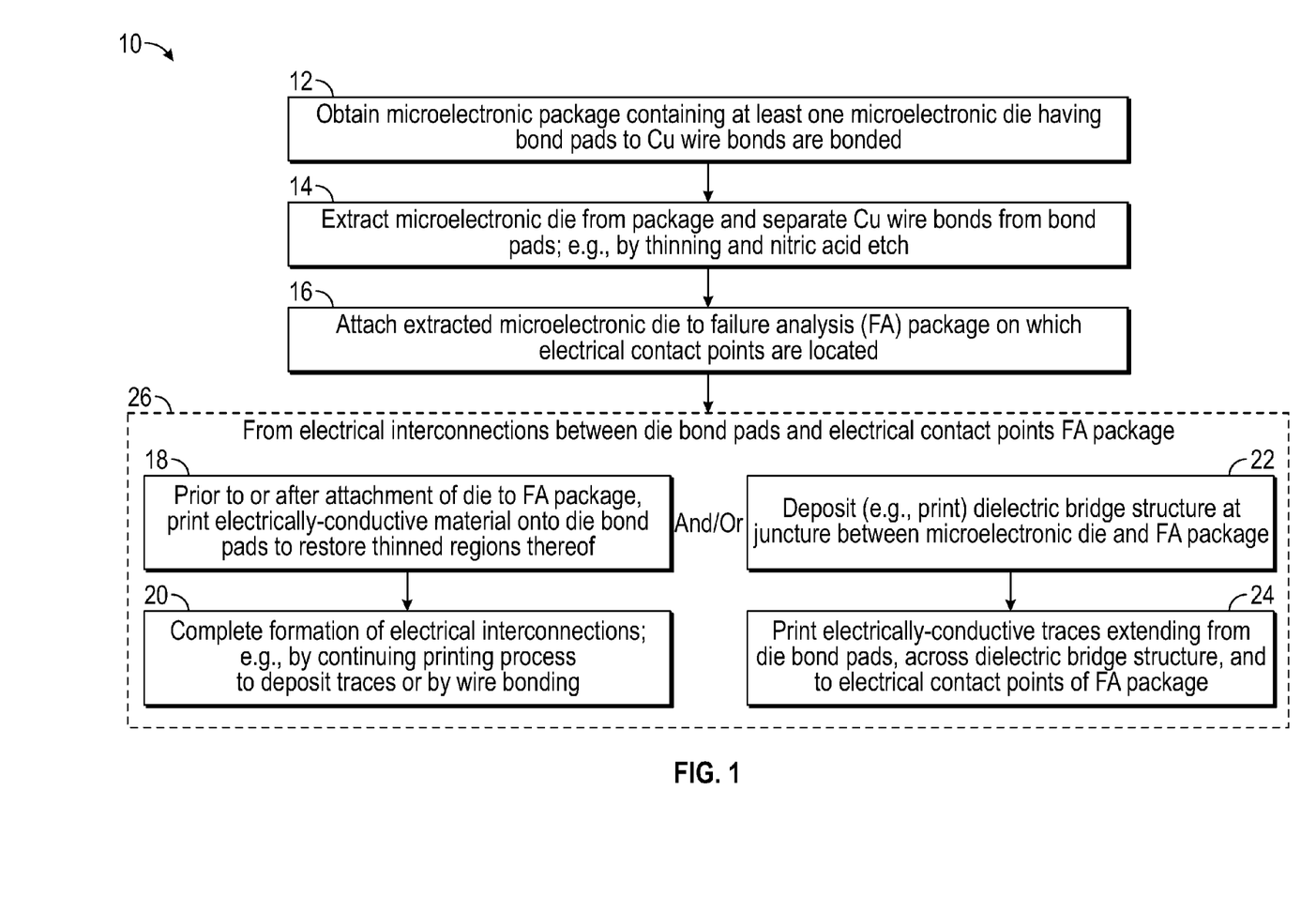
FIG. 1 is a flowchart setting-forth a method for repackaging a copper wire bonded microelectronic die, as illustrated in accordance with an exemplary embodiment of the present disclosure.

FIG. 1 is a flowchart setting-forth a method 10 for repackaging a Cu wire bonded microelectronic die, as illustrated in accordance with an exemplary embodiment of the present disclosure. Repackaging method 10 includes a number of process STEPS 12, 14, 16, 18, 20, 22, and 24, with STEPS 18, 20, 22, and 24 performed as part of a larger PROCESS BLOCK 26. Depending upon the manner in which repackaging method 10 is implemented, each step generically illustrated in FIG. 1 may entail a single process or multiple sub-processes. Furthermore, the steps illustrated in FIG. 1 and described below are provided by way of non-limiting example only. In alternative embodiments of repackaging method 10, additional process steps may be performed, certain steps may be omitted, and/or the illustrated steps may be performed in alternative sequences. Repackaging method 10 is usefully performed when failure analysis is desirably carried-out for a Cu wire bonded microelectronic die contained within a preexisting microelectronic package. For this reason, repackaging method 10 is primarily described below in the context of larger failure analysis process. It is emphasized, however, that repackaging method 10 can be carried-out to repackage Cu wire bonded microelectronic dies for purposes other than failure analysis.

Repackaging method 10 commences by obtaining a microelectronic package, which contains at least one Cu wire bonded microelectronic die (STEP 12, FIG. 1). As appearing herein, the term "Cu (or copper) wire bonded microelectronic die" refers to a microelectronic die having bond pads to which one or more Cu wire bonds are bonded. The term "Cu wire bond," in turn, refers to a wire bond composed of relatively pure Cu or a Cu-based alloy; that is, an alloy containing Cu as its primary constituent in addition to lesser amounts of other metallic or non-metallic constituents. Finally, the term "microelectronic die" is broadly defined herein to generally encompass various different types of microelectronic die including, but not limited to, general purpose integrated circuit (IC) die, Application Specific Integrated Circuit (ASIC) die (e.g., microcontrollers and microprocessors), microelectromechanical System (MEMS) die, and other structures on which one or more microelectronic devices (e.g., integrated circuits, sensors, or actuators) are fabricated. A given microelectronic die can carry various different types of ICs without limitation, whether digital or analog in nature. The Cu wire bonded microelectronic package obtained during STEP 12 of repackaging method 10 (FIG. 1) can be obtained or acquired in any manner without limitation. In many cases, the Cu wire bonded microelectronic obtained during STEP 12 (FIG. 1) will be acquired when returned by a customer and identified as potentially faulty such that failure analysis is desirably performed to, for example, isolate any defects present on or within the microelectronic die.

Figure 2:
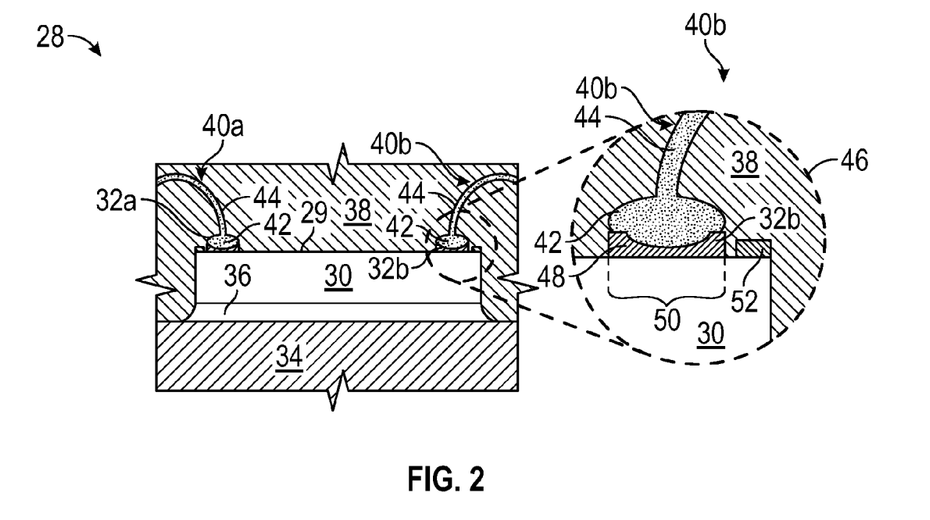
FIG. 2 is a cross-sectional view of a microelectronic package (partially shown) containing a copper wire bonded microelectronic die, as illustrated in accordance with an exemplary embodiment of the present disclosure.

FIG. 2 is a cross-sectional view of a microelectronic package 28 that may be obtained during STEP 12 of repackaging method 10 (FIG. 1). Microelectronic package 28 is only partially shown in FIG. 2 to help emphasize that various different types of microelectronic packages can be repackaged utilizing repackaging method 10 (FIG. 1). With respect to the illustrated example, specifically, microelectronic package 28 contains a Cu wire bonded microelectronic die 30 including an active surface or frontside 29 on which a plurality of die bond pads 32 is located. Only two die bond pads 32(a)-(b) are shown in the simplified cross-section of FIG. 2. It will be appreciated, however, that a greater number of bond pads 32 will typically be provided on microelectronic die 30 and spatially distributed in, for example, one or more rows extending at least one outer peripheral edge region of die 30. Microelectronic die 30 is mounted to a package substrate 34 utilizing a layer of die attach material 36. Package substrate 34 can be, for example, a Printed Circuit Board (PCB), an interposer, or any other structure suitable for physically supporting microelectronic die 30. Package substrate 34 may, but does not necessarily contain non-illustrated electrical routing features to which die bond pads 32 are electrically connected by Cu wire bonds, as described below.

Microelectronic die 30 is surrounded by an encapsulant 38, such as a mold compound, which is deposited over package substrate 34 and around die 30. A number of Cu wire bonds 40 (partially shown) are further contained within microelectronic package 28 and embedded within encapsulant 38. Cu wire bonds 40 are bonded to bond pads 32 to electrically interconnect microelectronic die 30 with other, non-illustrated electrically-conductive features contained within microelectronic package 28, such as electrical routing features (e.g., contact pads) provided on package substrate 34. In this regard, and as shown in FIG. 2, two such Cu wire bonds 40(a)-(b) are contained within microelectronic package 28 and bonded to bond pads 32(a)-(b), respectively. Cu wire bonds 40(a)-(b) are each formed to include enlarged terminal ends or ball portions 42, which are bonded directly to bond pads 32(a)-(b); and elongated wire bodies 44, which extend from ball portions 42 to the opposing terminal ends of the wire bonds (not shown). Additional, non-illustrated Cu wire bonds 40 similar or identical to bond pads 32(a)-(b) are formed in contact with the other, non-illustrated bond pads 32 distributed across upper or active surface 29 of microelectronic die 30.

As indicated above, one or more ICs, MEMS devices, and/or other such microelectronic devices are fabricated on microelectronic die 30. Die bond pads 32 serve as points-of-contact for providing signal communication with and power transfer to the ICs, MEMS devices, and/or other microelectronic devices carried by microelectronic die 30. Die bond pads 32 may be produced from a metal, such as aluminum, that is softer than the Cu wire utilized to produce Cu wire bonds 40. This disparity in hardness, along with the temperatures and pressures involved in the wire bonding process, may result in the creation of relatively pronounced depressions or concavities in central areas of die bond pads 32. This may be appreciated by referring to detail bubble 46 appearing on the right side of FIG. 2. As can be seen in detail bubble 46, a relatively deep depression or concavity 48 has been created within a central portion 50 of bond pad 32(b). Concavity 48 may be created when Cu wire bond 40(b) is bonded or joined to bond pad 32(b). Specifically, during wire bonding, concavity 48 may be created as ball portion 42 of wire bond 40(b) is heated and pressed against the upper surface of bond pad 32(b) in a manner causing radial outflow or creep of the bond pad material away from central portion 50 of bond pad 32(b). While only bond pad 32(b) and wire bond 40(b) are shown in detail bubble 46, similar concavities or depression may likewise be created in bond pad 32(a) and the other non-illustrated bond pads included within microelectronic package 28.

While Cu wire bonded microelectronic die 30 remains encapsulated within microelectronic package 28, the concavities created within bond pads 32 remain filled with the Cu wire bond material. For example, and with continued reference to detail bubble 46, concavity 48 created within bond pad 32(b) remains filled with the Cu wire bond material of Cu wire bond 40(b). Under normal use conditions, the existence of such concavities poses little issue and potentially may help improve joint reliability at the wire bond-bond pad interface. However, in instances wherein it is desirable to repackage Cu wire bonded microelectronic die 30 and, therefore, extract microelectronic die 30 from microelectronic package 28, Cu wire bonds 40 may be wholly destroyed and the concavities formed within bond pads 32 (e.g., concavity 48 within bond pad 32(b)) exposed. This can be problematic when, during repackaging, a conventional wire bonding approach is employed to interconnect bond pads 32 with corresponding electrical contacts provided on an FA package. However, in the case of repackaging method 10, a post die-extraction printing process is utilized to fill the concavities and structurally restore bond pads 32(b) and/or to form electrical interconnect lines extending from bond pads 32 to the corresponding electrical contacts provided on an FA package. This is described more fully below in connection with PROCESS BLOCK 26 (FIG. 1). First, however, additional description of microelectronic die 30 and the preceding steps of repackaging method 10 is provided.

With continued reference to FIGS. 1 and 2, Cu wire bonded microelectronic die 30 may also include peripheral electrically-conductive features, which are located outboard of bond pads 32; that is, electrically-conductive features located further from the centerline of microelectronic die 30 and closer to the outer peripheral edges of die 30 than are bond pads 32. An example of such a peripheral electrically-conductive feature is shown in detail bubble 46 (FIG. 2). In this particular example, the peripheral electrically-conductive feature is the remnants of a test pad 52, which is located closer to the illustrated outer peripheral edge of microelectronic die 30 than is bond pad 32(b). Stated differently, test pad remnant 52 is located between bond pad 32(b) and an outer edge of die 30. Test pad remnant 52 may be remains of a test pad 52, the bulk of which was previously located in the kerf area of the semiconductor wafer from which microelectronic die 30 was produced. During singulation of the semiconductor wafer, the remainder of the test bond pad was removed leaving behind test pad remnant 52. In other embodiments, microelectronic die 30 may include a different type of peripheral electrically-conductive feature (e.g., a bond pad or trace) or may lack any peripheral electrically-conductive features outboard of bond pads 32.

Figure 3:
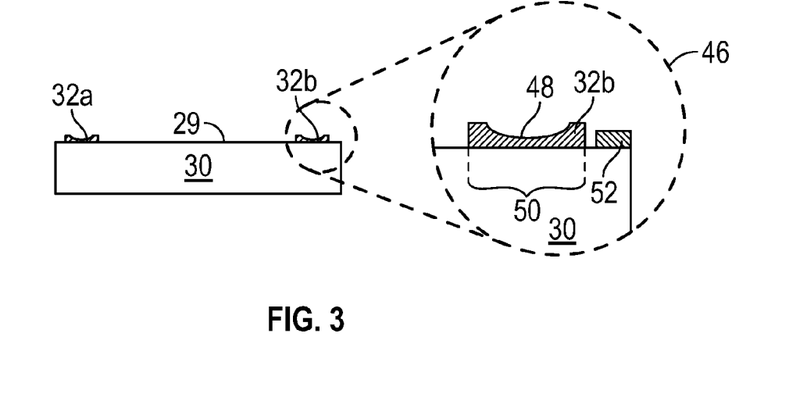
FIGS. 3-7 are cross-sectional views illustrating one manner in which the copper wire bonded microelectronic die shown in FIG. 2 can be repackaged utilizing a first type of failure analysis package in a first exemplary implementation of the repackaging method set-forth in FIG. 1.

Continuing with exemplary repackaging method 10, microelectronic die 30 is next extracted from microelectronic package 28 (STEP 14, FIG. 1). Microelectronic die 30 can be extracted from microelectronic package 28 in any manner separating Cu wire bonds 40 from bond pads 32 and revealing the upper bond surfaces; the term "upper" and similar terms of orientation, such as "lower," utilized in a non-limiting sense with reference to the accompanying drawing figures. In one embodiment, microelectronic die 30 is extracted by first thinning the frontside and/or backside of microelectronic package 28. Microelectronic package 28 may be thinned by grinding, Chemical Mechanical Polishing or Planarizing (CMP), or a combination thereof. After thinning (if performed), encapsulant 38 surrounding microelectronic die 30 may be removed by treatment with an appropriate etchant, such as a fuming nitric acid etch. As indicated above, such an etchant may also be highly selective toward Cu and Cu-based alloys and, consequently, destroy Cu wire bonds 40 in their entirety or substantial entirety. The results of such a die extraction process are illustrated in FIG. 3. As can be seen, treatment with fuming nitric acid (or a similar encapsulant-selective etchant) has removed Cu wire bonds 40 in their entirety thus leaving the concavities within bond pads 32 partially or wholly unfilled. With reference to the portion of microelectronic die 30 shown in detail bubble 46, specifically, Cu wire bond 40(b) may be wholly removed such that concavity 48 of bond pad 32(b) is now emptied or devoid of electrically-conductive material.

Figure 4:
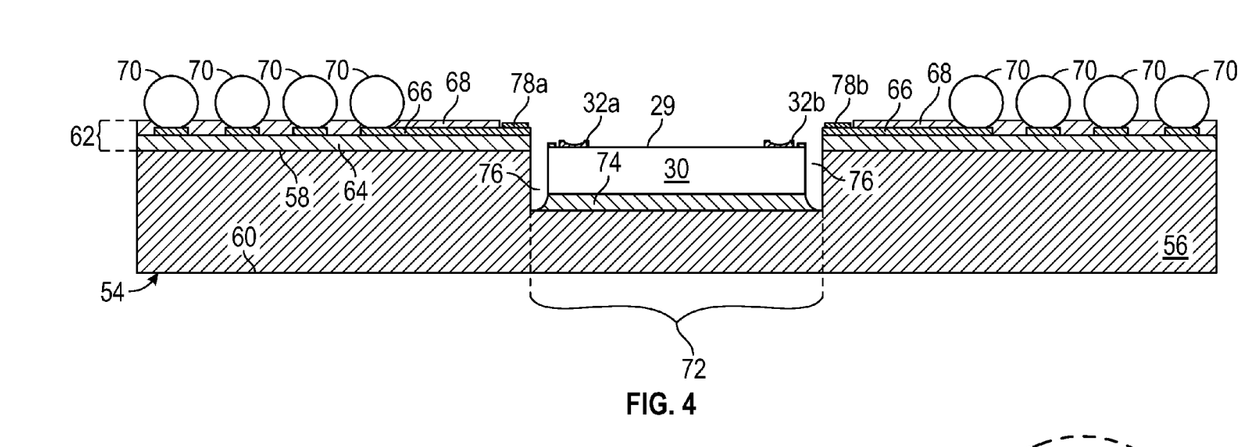

Advancing to STEP 16 of repackaging method 10 (FIG. 1), newly-extracted microelectronic die 30 is next attached or mounted to an FA package. The FA package can be any structure or device suitable for physically supporting die 30 and including electrically-conductive features to which bond pads 32 are desirably electrically interconnected. An example of such an FA package 54 is shown in FIG. 4 in cross-section. In this particular example, FA package 54 includes a package substrate 56 having an upper surface or topside 58 and a lower surface or backside 60. A Redistribution Layer (RDL) structure 62 is formed over topside 58 of package substrate 56. RDL structure 62 includes a dielectric layer 64, at least one patterned metal level 66 formed in or over dielectric layer 64, and a solder mask layer 68. A number of solder balls 70 are deposited in openings formed in solder mask layer 68 and in contact with selected portions of patterned metal level 66 to form a Ball Grid Array (BGA). In further embodiments, FA package 54 can include additional metal levels interspersed with dielectric layers to form more complex wiring structures. Alternative embodiments of FA package 54 can include other types of Input/Output (I/O) interfaces and associated interconnect structures, which can include any combination of contact arrays (e.g., BGAs, Land Grid Arrays, bond pads, stud bumps, etc.), RDL structures, leadframes, interposers, wire bonds, through package vias, and the like.

An open cavity 72 is formed in a central portion of package substrate 56. During STEP 16 of repackaging method 10 (FIG. 1), microelectronic die 30 is installed within open cavity 72 and affixed to FA package 54 utilizing, for example, a layer 74 of die attach material. The dimensions of open cavity 72 may be selected to accommodate a wide range of microelectronic dies, which vary in height, width, and/or length. In this manner, multiple FA packages 54 can be prefabricated, stored, and utilized on an as-needed basis to perform failure analysis on multiple different die types in a manufacture's catalogue. Accordingly, the planform dimensions (the length and width) of open cavity 72 may be greater than the corresponding planform dimensions (the length and width) of microelectronic die 30. When die 30 is properly centered within cavity 72, lateral air gaps 76 are created between the outer periphery of microelectronic die 30 and the inner sidewalls of FA package 54 defining or bordering open cavity 72.

FA package 54 further includes a number of electrical contact points (e.g., contact pads, terminals, conductive leadframe portions, etc.) to which bond pads 32 of extracted microelectronic die 30 are desirably interconnected. In the illustrated example, the electrical contact points of FA package 54 assume the form of contact pads 78 formed within patterned metal level 66 at locations adjacent open cavity 72. Depending upon the depth of open cavity 72, the thickness of die attach layer 74, and the height of microelectronic die 30, contact pads 78 of FA package 54 and bond pads 32 of microelectronic die 30 will often be located at different elevations or heights within FA package 54, as measured along the centerline of microelectronic die 30 or along an axis orthogonal to frontside 29 of die 30. For example, as indicated in FIG. 5, contact pads 78 of FA package 54 may be located at an elevation that is higher than bond pads 32 of microelectronic die 30.

Exemplary repackaging method 10 (FIG. 1) next progresses to PROCESS BLOCK 26 during which electrical interconnections are formed between bond pads 32 of microelectronic die 30 and contact pads 78 of FA package 54. In embodiments wherein bond pads 32 include severe concavities or other pronounced structural deformities, formation of the electrical interconnections may entail three dimensional (3D) printing of electrically-conductive material onto bond pads 32 to structurally restore the deformed (e.g., pocked or concave) regions thereof. This is indicated at STEP 18 of repackaging method 10 (FIG. 1), which is advantageously (but not necessarily) performed when bond pads 32 have been rendered highly concave by previous Cu wire bonding processes. In this case, bodies of conductive material (referred to hereafter as a "conductive bond pad caps") may be printed onto upper surfaces of bond pads 32 to substantially or entirety fill any concavities, depressions, or through holes formed therein. The bond pad caps can be printed to restore bond pads 32 to dimensions substantially matching or exceeding the dimensions of bond pads 32 prior to Cu wire bonding. As appearing herein, the term "printing process," the term "print," and similar terms are utilized refer to deposition processes allowing a flowable material to be selectively dispensed or applied to one or more surfaces of a structure in a highly precise, computer-controlled manner. Exemplary printing processes suitable for forming conductive bond pad caps and/or other structures deposited during repackaging method 10 (FIG. 1) are described in more detail below.

Figure 5:
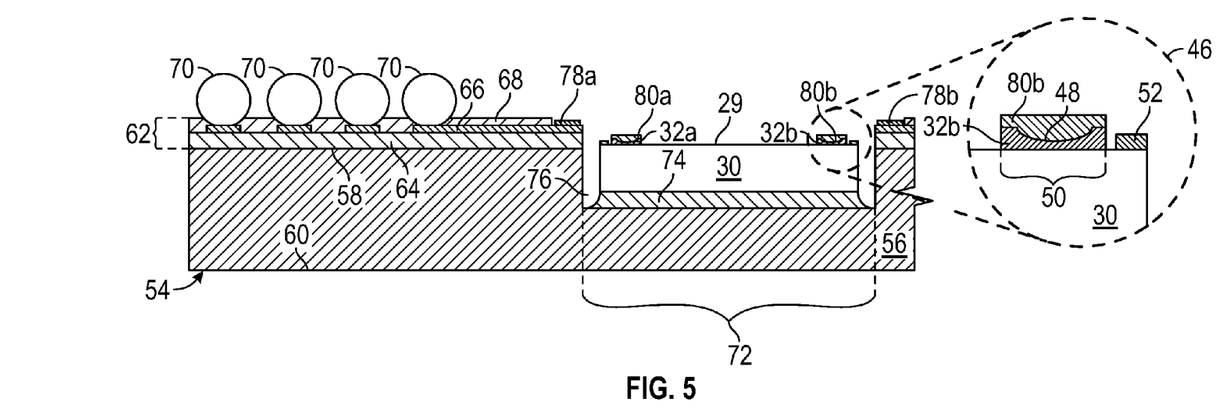

FIG. 5 illustrates FA package 54 and microelectronic die 30 after printing of electrically-conductive bond pad caps 80 onto severely concave contact pads. Referring specifically to detail bubble 46, it can be seen that a bond pad cap 80(b) is printed onto bond pad 32(b) in sufficient volume to fill concavity 48. Additionally, in the illustrated example, bond pad cap 80(b) is printed to include a substantially planar upper surface. Such a substantially planar upper surface may facilitate completion of the electrical interconnection between bond pad 32(b) and its associated contact pad 78(b) in certain embodiments. This example notwithstanding, bond pad cap 80(b), bond pad cap 80(a), and the other non-illustrated bond pad caps need not be imparted with substantially planar upper surfaces in all embodiments. Instead, in further embodiments, the printed material may be deposited to have a non-planar upper surface and, perhaps, to be substantially conformal to the concave shape of the underlying bond pad. Additionally, while bond pad caps 80 are deposited to substantially cover the entire upper surface of bond pads 32 in the illustrated example, this need not be the case in all embodiments.

Figure 7:
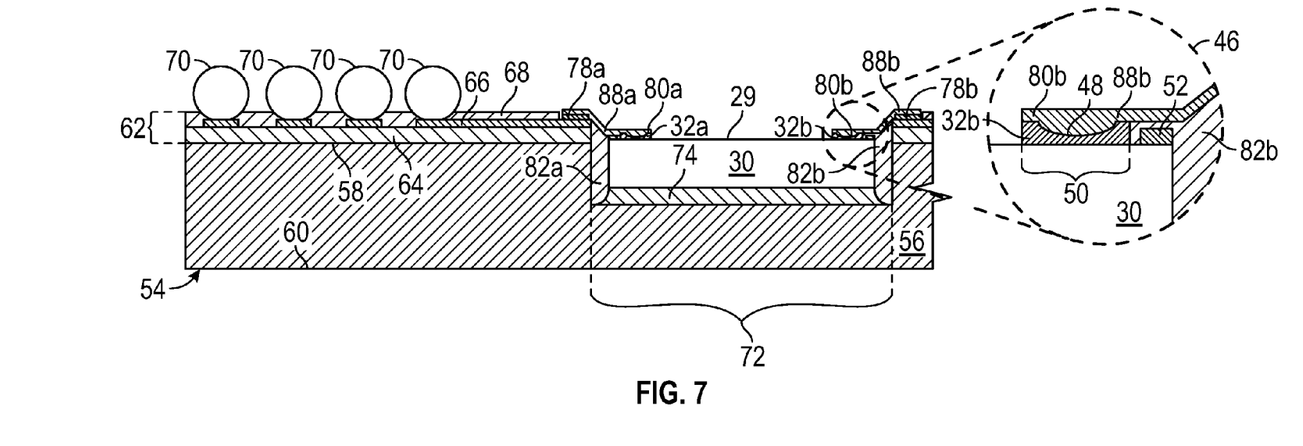

The printing process utilized to produce electrically-conductive bond pad caps 80 can be similar or substantially identical to the printing process utilized to form electrically-conductive traces 88, as described below in detail in conjunction with FIG. 7. In one embodiment, an electrically-conductive ink is selectively printed (e.g., utilizing an aerosol or inkjet printing process) onto bond pads 32 to predetermined dimensions to yield bond pad caps 80. Suitable electrically-conductive inks include, but are not limited to, inks containing relatively small metal particles, such as Au, Cu, or silver (Ag) particles in the nanometer range. Thermal or ultraviolet curing can be performed after printing of the electrically-conductive bond pad caps 80, as appropriate. Furthermore, while printed after attachment of microelectronic die 30 to FA package 54 in the illustrated example, conductive bond pad caps 80 can be printed prior to attachment of microelectronic die 30 to FA package 54 in further embodiments.

After printing electrically-conductive bond pad caps 80 onto bond pads 32, additional processes may be carried to complete formation of the electrical interconnections between bond pads 32 and corresponding contact pads 78 on FA package 54 (STEP 20, FIG. 1). In certain embodiments, wire bonding may be utilized to complete the desired electrical interconnections. In this case, ball bonding or another wire bonding processes can be performed utilizing Cu wire, Au wire, or another wire material. During the wire bonding process, a first terminal end of each wire bond is formed in contact with one of electrically-conductive bond pad caps 80. Again, bond pad caps 80 may provide (but need not necessarily provide) substantially planar or flat upper surfaces to facilitate wire bonding. To complete each wire bond the connection, the opposing terminal end of the wire may then be bonded to the appropriate FA package contact pad 78. This notwithstanding, wire bonding may not be utilized to complete the interconnections between bond pads 32 and contact pads 78 on FA package 54 in all embodiments. Instead, the electrical interconnections can be completed by further printing electrically-conductive traces extending from conductive bond pad caps 80 and bond pads 32 to corresponding contact pads 78, as described more fully below in conjunction with STEP 24 of repacking method 10 (FIG. 1). In this case, a common printing process can be utilized form both conductive bond pad caps 80 and the below-described printed traces or interconnect lines. In still further embodiments of repackaging method 10, such as implementations wherein relatively deep concavities or openings are not formed in bond pads 32, bond pad caps 80 may not be deposited and method 10 may progress directly from STEP 16 to STEP 22 of PROCESS BLOCK 26 (FIG. 1).

Certain embodiments of repackaging method 10 may involve printing of electrically-conductive traces or interconnect lines extending from bond pads 32 (and possibly conductive bond pad caps 80, if present) to corresponding electrical contact points (e.g., contact pads 78) provided on FA package 54. In such embodiments, it may also be desirable to deposit one or more dielectric bridge structures at selected junctures between microelectronic die 30 and FA package 54. Each dielectric bridge structures can be deposited to provide a continuous, non-stepped surface extending from microelectronic die 30 to the surface of FA package 54 on which contact pads 78 are located. When bond pads 32(b) (and bond pad caps 80, if present) are located at a different elevation than are FA package contact pads 78, the dielectric bridge structures can further be printed or otherwise deposited to include ramped or sloped upper surfaces accommodate this disparity in elevation. Finally, when peripheral electrically-conductive features are located on microelectronic die 30 laterally outboard of bond pads 32, the dielectric bridge structures can be formed to cover such peripheral electrically-conducive features to provide electrical isolation with the subsequently-deposited traces or interconnect lines, as described more fully below in conjunction with FIG. 6.

Figure 6:
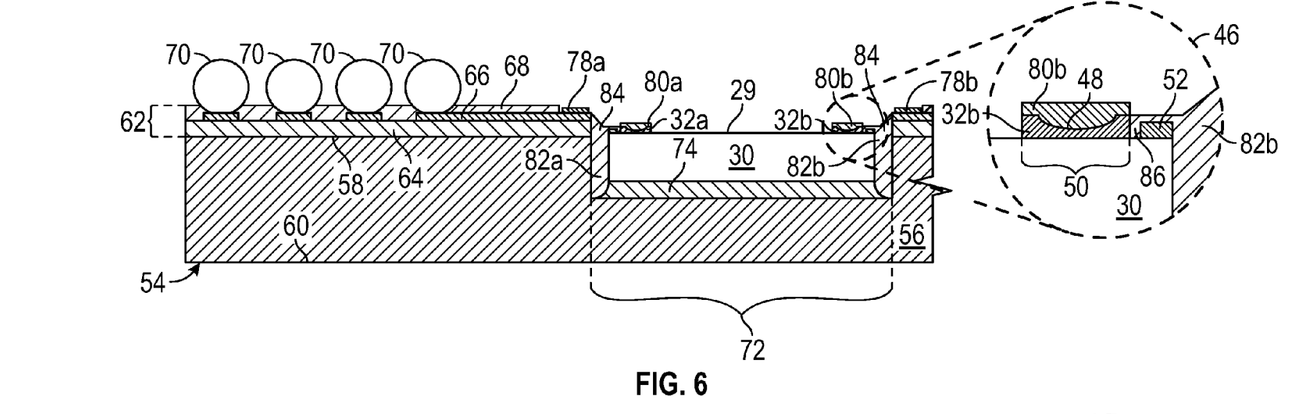

FIG. 6 is a cross-sectional view of FA package 54 and microelectronic die 30 after deposition of dielectric bridge structures 82 during STEP 22 of repackaging method 10 (FIG. 1). Two dielectric bridge structures 82 can be seen: (i) a first dielectric bridge structure 82(a) deposited at a first juncture between microelectronic die 30 and a first inner sidewall of FA package 54 bounding open cavity 72, and (ii) a second dielectric bridge structure 82(b) deposited at a second juncture between microelectronic die 30 and a second inner sidewall of FA package 54 bounding cavity 72. Dielectric material may be deposited to extend substantially around the entire periphery of microelectronic die 30 such that dielectric bridge structures 82(a)-(b) are integrally formed as a ring-shaped structure when viewed from a planform or top-down perspective. Alternatively, dielectric material may be exclusively deposited along the two illustrated sidewalls of microelectronic die 30 extending into the plane of the page in FIG. 6 such that dielectric bridge structures 82(a)-(b) are discrete, non-contacting bodies. In either case, dielectric bridge structures 82(a)-(b) may be deposited in sufficient volume to fill lateral gaps 76 (labeled in FIG. 5) between die 30 and the inner sidewalls of FA package 54 bounding cavity 72 and thereby provide a physical bridge or connective body onto which the below-described electrically-conductive traces can be conformally printed.

Dielectric bridge structures 82 can be selectively deposited utilizing various different deposition techniques including, for example, fine needle dispense and 3D printing processes of the type described herein. In one embodiment, dielectric bridge structures 82 are gradually built-up at the junctures between microelectronic die 30 and FA package 54 utilizing a 3D printing process, such as a computer-controlled inkjet printing or aerosol jet printing technique. Dielectric bridge structures 82 can be composed of various different dielectric materials including, but not limited to, polyimide materials and deposited ceramic materials. Thermal or ultraviolet curing may be performed after deposition of dielectric bridge structures 82, as appropriate. In certain embodiments, dielectric bridge structures 82 may be composed from a material selected to have a lower etch rate than does package substrate 56 when contacted by a suitable etchant, such as a nitric acid etchant (e.g., fuming nitric acid) or another etchant selective to the package substrate material. In this manner, dielectric bridge structures 82 may be better preserved to maintain microelectronic die 30 in its desired position should controlled etching of package substrate 56 be performed to reveal the backside of die 30 for additional backside failure analysis testing. In this case, prior to backside analysis, microelectronic die 30 may be encapsulated within an epoxy or other material deposited utilizing an aerosol jet printing, needle dispense, or a molding processing, to list but a few examples.

The bond pads of the microelectronic die may be located at a different elevation than are the electrical contact points of the FA package when the microelectronic die is attached to the FA package during STEP 16 of repackaging method 10 (FIG. 1). In this case, dielectric bridge structures 82 may be deposited to have ramped or sloped upper surface providing a transition from the first elevation to the second elevation. Consider further the example shown in FIG. 6 wherein bond pads 32 are located at a first elevation, while electrical contact pads or points 78 of FA package 54 are located at a second elevation different than the first elevation. As can be seen, dielectric bridge structures 82 have been deposited to include ramped upper surfaces 84, which extend at a an angle from the bond pad-bearing surface 29 of microelectronic die 30 to the surface of FA package 54 on which electrical contact points 78 are located. Ramped upper surfaces 84 of dielectric bridge structures 82 thus provide a gradual transition or a continual, non-stepped surface over which the electrically-conducive traces can be conformally printed, as described more fully below in conjunction with STEP 24 of repackaging method 10 (FIG. 1).

In embodiments wherein microelectronic die 30 includes peripheral electrically-conductive features located laterally outboard of bond pads 32, dielectric bridge structures 82 may be deposited to include extended regions or overburden portions covering the peripheral electrically-conductive features. Consider, for example, detail bubble 46 in FIG. 6 wherein dielectric bridge structure 82(b) has been printed or otherwise deposited to include an overburden portion 86 encroaching onto upper surface 29 of microelectronic die 30 to cover test pad remnant 52. Overburden portion 86 of dielectric bridge structure 82(b) prevents undesirable electrical coupling between test pad remnant 52 and a subsequently-formed electrically-conductive trace, which is conformally printed over upper surface 84 of dielectric bridge structure 82(b) in the manner described below in conjunction with STEP 24 of repackaging method 10 (FIG. 1). Dielectric bridge structure 82(a) and the other non-illustrated dielectric bridge structures may also be printed to include such extensions or overburden portions, as appropriate, to prevent electrical bridging to any peripheral electrically-conductive features present on upper surface 29 of microelectronic die 30.

Turning lastly to STEP 24 of repackaging method 10 (FIG. 1), electrically-conductive traces or interconnect lines are next printed in, for example, a predetermined pattern to interconnect microelectronic die 30 and FA package 54. Specifically, the electrically-conductive trace may be printed to extend from bond pads 32, across upper surfaces 29 of dielectric bridge structures 82, and to corresponding electrical contact points or pads 78 on FA package 54. For example, as shown in FIG. 7, a first electrically-conductive trace 88(a) can be printed to extend from bond pad 32(a) across upper ramped surface 84 of dielectric bridge structure 82(a), and to electrical contact point 78(a) of FA package 54.

Similarly, a second electrically-conductive trace 88(b) is printed to extend from bond pad 32(b) across ramped surface of 84 of dielectric bridge structure 82(b), and to electrical contact point 78(b) of FA package 54. Electrically-conductive traces 88 may substantially conform or follow the topology or surface geometry of the surfaces onto which traces 88 are printed. Electrically-conductive traces 88 may be printed to any desired dimensions. In one embodiment, electrically-conductive traces 88 are printed to a width between 25 and 75 microns (μm) and a thickness between 5 and 20 μm. In further embodiments, electrically-conductive traces 88 may be printed to thicker, thinner, wider, or narrower dimensions.

Printed electrically-conductive trace 88(a), printed electrically-conductive trace 88(b), and the other non-illustrated printed traces or interconnect lines can be printed utilizing any dispensing technique allowing the selective deposition of an electrically-conductive ink in a predetermined pattern or design. As indicated above, a non-exhaustive list of suitable printing techniques includes inkjet printing, aerosol printing, and needle dispensing techniques. In one embodiment, the printing process may be fully automated and carried-out in accordance with a pre-established Computer-Aided Design (CAD) model or other 3D object data. In other embodiments, the printing process may be semi-automated and involve a user specifying two dimension or three dimensional coordinates to guide the printing process. In other Suitable materials for forming printed electrically-conductive traces 88 include, but are not limited to, particle-filled inks, electrically-conductive polymers, solder pastes, solder-filled adhesives, and metal-containing adhesives or epoxies, such as silver-, nickel-, and copper-filled epoxies. In one embodiment, electrically-conductive traces 88 are produced from an ink containing relatively small metal particles, such as gold, copper, or silver particles in the nanometer range; e.g., particles having average diameters ranging from about 2 to about 50 nanometers. Thermal or ultraviolet curing can be performed after printing of the electrically-conductive ink traces, as appropriate. After printing traces 88 at STEP 24, repackaging method 10 concludes. Failure analysis may now performed on repackaged microelectronic die 30 utilizing FA package 54 to, for example, permit defect localization on microelectronic die 30.

Figure 8:
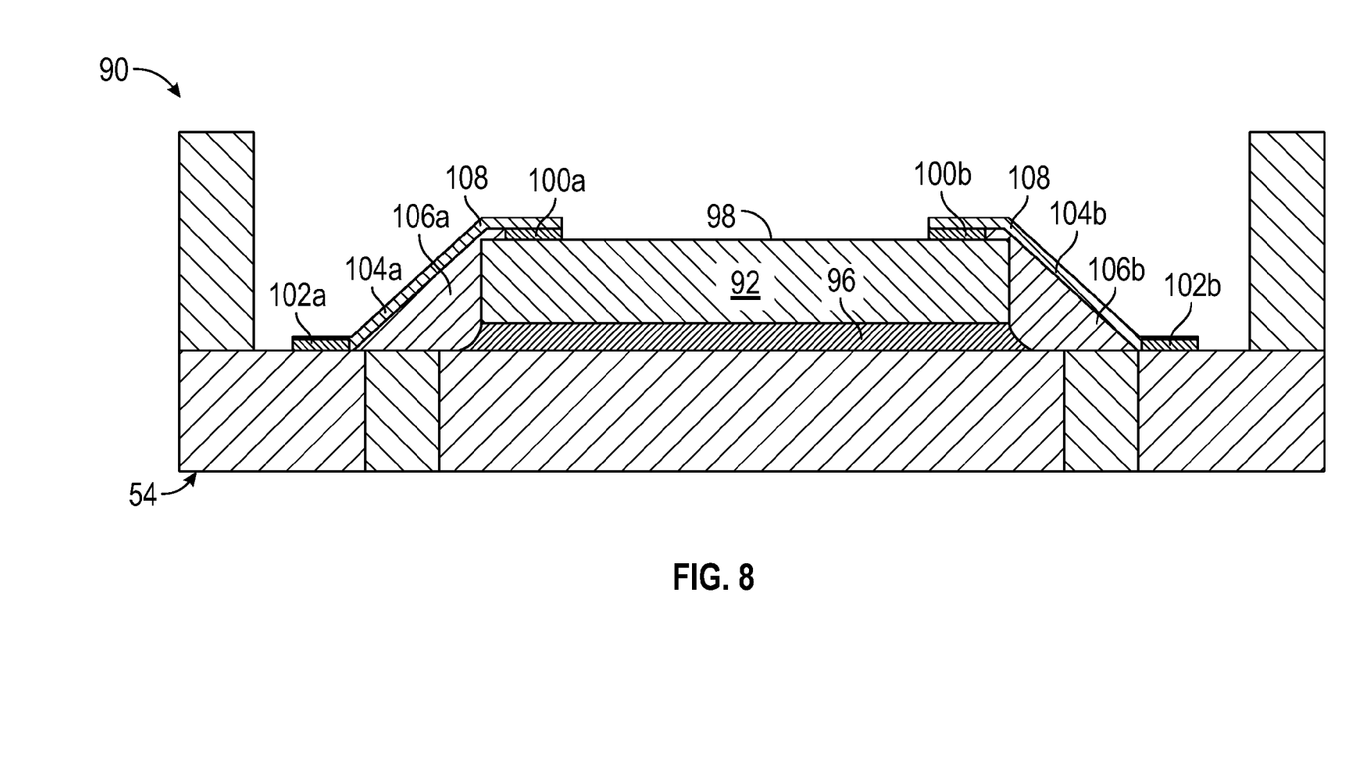
FIG. 8 is a cross-sectional view illustrating the copper wire bonded microelectronic die shown in FIG. 2 after repackaging utilizing a second type of failure analysis package in a second exemplary implementation of the repackaging method set-forth in FIG. 1.

In the above-described embodiment, the extracted microelectronic die was installed within a particular type of FA package (namely, a Tape Ball Grid Array or TBGA package). However, in further embodiments, the extracted microelectronic die can be installed within various other types of FA packages, providing that electrically-conductive material is printed in contact with the die bond pads in the process of forming bond pad caps, forming printed interconnect lines or traces, or a combination thereof. To further emphasize this point, FIG. 8 provides a cross-sectional view of a repackaged assembly 90 including a microelectronic die 92, which was previously extracted from a Cu wire-containing microelectronic package and subsequently installed within a new FA package 94. In this particular example, FA package 94 assumes the form of a leadless package and, specifically, a quad flat no-leads package. As was previously the case, microelectronic die 92 is mounted to FA package 94 utilizing a layer of die attach material 96; dielectric bridge structures 106 are printed or otherwise deposited at junctures or intersections between die 92 and FA package 94; and electrical interconnect lines or electrically-conductive traces 104 are printed to extend from bond pads 100 located on an upper or active surface 98 of die 92, across the sloped or ramped upper surfaces of dielectric bridge structures 106, and to electrical contact points 102 (e.g., contact pads) provided on FA package 94. Again, electrically-conductive traces 104 can be printed utilizing, for example, an aerosol jet or inkjet printing process. However, in contrast to the example discussed above in conjunction with FIGS. 2-7, bond pads 100 of microelectronic die 92 are located at a higher elevation than are contact pads 102 of FA package 94. Dielectric bridge structures 106 are thus deposited to include ramped upper surfaces 108, which angle downward when progressing from microelectronic die 92 to the regions of FA package 94 on which contact pads 102 are located.

There has thus been provided multiple exemplary embodiments of a method for repackaging a Cu wire bonded microelectronic die, which enables reliable interconnection of an FA package with the microelectronic die after extraction from an original microelectronic package containing Cu wire bonds. During the repackaging method, a post die-extraction printing process is utilized to deposit an electrically-conductive material (e.g., a metal-containing ink) onto the bond pads of a newly-extracted microelectronic die. In certain embodiments, the post die-extraction printing process is employed to produce electrically-conductive tracks or traces, which electrically interconnect the bond pads of the extracted microelectronic die with electrical contact points (e.g., contact pads or terminals) provided on an FA package. Additionally or alternatively, the post die-extraction printing process can be controlled to structurally rebuild or restore damaged (e.g., severely concave) regions of the die bond pads. The restored die bond pads can then be electrically interconnected with the FA package contact points by wire bonding or by continuing the 3D printing process to further deposit electrically-conductive traces.

In one embodiment, the above-described repackaging method includes the step or process of obtaining a microelectronic package containing Cu wire bonds and a microelectronic die, which includes bond pads to which the Cu wire bonds are bonded. The microelectronic die is extracted from the microelectronic package in a manner separating the Cu wire bonds from the bond pads. The microelectronic die is then attached or mounted to a FA package having electrical contact points thereon. Electrical connections are then formed between the bond pads of the microelectronic die and the electrical contact points of the FA package at least in part by printing an electrically-conductive material onto the bond pads.

In another embodiment, the method includes the obtaining a microelectronic die including bond pads having concave or thinned regions therein. An electrically-conductive material is selectively deposited onto the bond pads to at least partially structurally restore the concave regions of the bond pads utilizing a 3D printing process, such as an inkjet or aerosol jet printing process. Prior to or after selectively depositing the electrically-conductive material onto the bond pads, the microelectronic die is attached to a package (e.g., an FA package) having electrical contact points thereon. Electrical connections are then formed between the bond pads of the microelectronic die and the electrical contact points of the package, for example, by wire bonding or by printing electrically-conductive traces or interconnect lines in contact with the microelectronic die and the package.

In a still further embodiment, the repackaging method includes the steps or processes of obtaining a microelectronic package containing Cu wire bonds and a microelectronic die having bond pads bonded to the Cu wire bonds. The microelectronic die is extracted from the microelectronic package, while the Cu wire bonds are separated from the bond pads. The microelectronic die is then mounted or attached to a FA package having electrical contact points thereon. A dielectric bridge structure is then printed or otherwise deposited at a juncture between the FA package and the microelectronic die. Electrical connections are then formed contacting and extending from the bond pads of the microelectronic die, over the dielectric bridge structure, and to the electrical contact points of the FA package.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for repackaging copper wire bonded microelectronic die, the method comprising:
   obtaining a microelectronic package containing copper wire bonds and a microelectronic die, the microelectronic die having bond pads to which the copper wire bonds are bonded;
   extracting the microelectronic die from the microelectronic package, while separating the copper wire bonds from the bond pads;
   attaching the microelectronic die to a failure analysis (FA) package having electrical contact points thereon; and
   forming electrical connections between the bond pads of the microelectronic die and the electrical contact points of the FA package at least in part by printing an electrically-conductive material onto the bond pads.

2. The method of claim 1 wherein printing comprises utilizing a three dimensional printing process to selectively deposit the electrically-conductive material onto surfaces of the bond pads exposed by separation of the copper wire bonds therefrom.

3. The method of claim 1 wherein forming comprises forming the electrical connections between the bond pads of the microelectronic die and the electrical contact points of the FA package at least in part by depositing the electrically-conductive material onto the bond pads utilizing an aerosol jet printing process.

4. The method of claim 1 wherein the forming comprises printing electrically-conductive traces extending from the bond pads of the microelectronic die to the electrical contact points of the FA package.

5. The method of claim 4 further comprising depositing a dielectric bridge structure onto the FA package and adjacent the microelectronic die prior to printing the electrically-conductive traces, and wherein printing comprises printing the electrically-conductive traces to extend across the dielectric bridge structure.

6. The method of claim 5 wherein attaching comprises attaching the microelectronic die to the FA package such that the bond pads of the microelectronic die are located at a first elevation, while the electrical contact points of the FA package are located at a second elevation different than the first elevation;

wherein depositing comprises depositing the dielectric bridge structure to comprise a ramped upper surface providing a transition from the first elevation to the second elevation; and wherein printing comprises printing the electrically-conductive traces to extend across the ramped upper surface of the dielectric bridge structure.

7. The method of claim 5 wherein depositing comprises utilizing a three dimensional printing technique to build-up the dielectric bridge structure at a juncture formed by the FA package and the microelectronic die.

8. The method of claim 5 wherein depositing comprises depositing the dielectric bridge structure to extend at least partially around an outer perimeter of the microelectronic die.

9. The method of claim 5 wherein attaching the microelectronic die comprises mounting the microelectronic die to a substrate included within the FA package, and wherein depositing comprises forming the dielectric bridge structure from a dielectric material selected to have a lower etch rate having than does the substrate when contacted by a nitric acid etchant.

10. The method of claim 5 wherein attaching comprises installing the microelectronic die in an open cavity provided in the FA package such that, when the microelectronic die and FA package is viewed in cross-section along a section plane orthogonal to a frontside of the microelectronic die, a lateral gap is created between a peripheral edge of the microelectronic die and a wall of the FA package partially defining the open cavity; and wherein depositing comprises depositing the dielectric bridge structure to substantially fill the lateral gap.

11. The method of claim 5 wherein microelectronic die comprises an upper die surface on which the bond pads are located, and wherein depositing comprises depositing the dielectric bridge structure to include an overburden portion encroaching onto the upper die surface.

12. The method of claim 11 wherein depositing comprises depositing the dielectric bridge structure such that the overburden portion covers at least one electrically-conductive feature on the upper die surface and located laterally outboard of at least one of the bond pads.

13. The method of claim 1 wherein concave regions within the bond pads are exposed when the copper wire bonds are separated from the bond pads; and wherein printing comprises printing electrically-conductive bond pad caps onto the bond pads filling the concave regions of the bond pads.

14. The method of claim 13 wherein printing further comprises continuing the printing process utilized to form the electrically-conductive bond pad caps to further produce electrically-conductive traces extending from the electrically-conductive bond pad caps to the electrical contact points of the FA package.

15. The method of claim 13 wherein forming electrical connections further comprises, after printing electrically-conductive bond pad caps onto the bond pads filling the concave regions of the bond pads, forming wire bonds extending from the electrically-conductive bond pad caps to the electrical contact points of the FA package.

16. A method for repackaging semiconductor copper wire devices, the method comprising:

obtaining a microelectronic package containing copper wire bonds and a microelectronic die having bond pads bonded to the copper wire bonds;

extracting the microelectronic die from the microelectronic package, while separating the copper wire bonds from the bond pads;

attaching the microelectronic die to a failure analysis (FA) package having electrical contact points thereon;

depositing a dielectric bridge structure at a juncture between the FA package and the microelectronic die; and forming electrical connections extending from the bond pads of the microelectronic die, over the dielectric bridge structure, and to the electrical contact points of the FA package.

17. The method of claim 16 wherein depositing comprises utilizing a three dimensional printing process to deposit the dielectric bridge structure to have a ramped upper surface over which the electrical connections extend.

* * * * *